(12) United States Patent
Heller et al.

(10) Patent No.: US 10,908,217 B2
(45) Date of Patent: Feb. 2, 2021

(54) VERIFICATION DEVICE AND METHOD FOR VERIFYING AN ELECTRICAL OVERVOLTAGE BETWEEN ELECTRICAL CONDUCTORS

(71) Applicant: Siemens Aktiengesellschaft, Munich (DE)

(72) Inventors: Janis Heller, Bad Neustadt (DE); Tobias Katzenberger, Bad Königshofen (DE); Bastian Plochmann, Neustadt an der Aisch (DE)

(73) Assignee: SIEMENS AKTIENGESELLSCHAFT, Munich (DE)

( * ) Notice: Subject to any disclaimer, the term of this patent is extended or adjusted under 35 U.S.C. 154(b) by 74 days.

(21) Appl. No.: 16/235,618

(22) Filed: Dec. 28, 2018

(65) Prior Publication Data
US 2019/0204389 A1 Jul. 4, 2019

(30) Foreign Application Priority Data
Dec. 29, 2017 (EP) ..................................... 17211117

(51) Int. Cl.
    *G01R 31/34*     (2020.01)
    *G01R 31/12*     (2020.01)
    *G01R 27/00*     (2006.01)

(52) U.S. Cl.
CPC ........... *G01R 31/343* (2013.01); *G01R 27/00* (2013.01); *G01R 31/1272* (2013.01); *G01R 31/346* (2013.01)

(58) Field of Classification Search
CPC .... G01R 31/343; G01R 27/00; G01R 31/346; G01R 31/1272; G01R 19/165; G01R 31/1263; G01R 31/12; H02H 3/22
See application file for complete search history.

(56) References Cited

U.S. PATENT DOCUMENTS 6,538,863 B1 * 3/2003 Macbeth .............. H02H 1/0015
                                                              361/42
7,990,156 B1     8/2011  Watkins
(Continued)

FOREIGN PATENT DOCUMENTS

CN           101552302 A     10/2009
CN           102637658 A      8/2012
(Continued)

*Primary Examiner* — Akm Zakaria
(74) *Attorney, Agent, or Firm* — Henry M. Feiereisen LLC

(57) ABSTRACT

A verification device for verifying an electrical overvoltage between two electrical conductors includes a conductor-track carrier made of an electrically insulating carrier material, a plurality of conductor tracks applied in spaced-apart relation from one another on the conductor-track carrier, and a measuring device acquiring an electrical resistance of one of the conductor tracks. Each of the two electrical conductors is electrically connected to at least one of the conductor tracks with the proviso that none of the conductor tracks is electrically connected to both of the two electrical conductors. The conductor tracks are configured such that a pre-specified overvoltage between the two electrical conductors causes a partial discharge that changes the electrical resistance of the one conductor track between the one conductor track and another one of the conductor tracks that is electrically connected to one of the two electrical conductors.

18 Claims, 2 Drawing Sheets

(56) References Cited

U.S. PATENT DOCUMENTS

| | | | | |
|---|---|---|---|---|
| 2006/0197234 A1* | 9/2006 | Pape | ................ | H01L 24/49 |
| | | | | 257/784 |
| 2012/0252176 A1 | 10/2012 | Lin | | |
| 2013/0049784 A1* | 2/2013 | Hirano | ............... | G01R 1/06761 |
| | | | | 324/755.01 |
| 2015/0066399 A1* | 3/2015 | Kasai | ................ | G01R 31/2812 |
| | | | | 702/58 |
| 2015/0207054 A1* | 7/2015 | Kanno | ................ | G01R 31/343 |
| | | | | 136/209 |
| 2016/0266707 A1* | 9/2016 | Nozaki | ................ | G06F 3/0416 |

FOREIGN PATENT DOCUMENTS

| | | | |
|---|---|---|---|
| CN | 202423296 U | 9/2012 | |
| CN | 102738001 A | 10/2012 | |
| CN | 103872299 A | 6/2014 | |
| DE | 40 04 445 A1 | 8/1991 | |
| RU | 137432 U1 | 2/2014 | |

\* cited by examiner

VERIFICATION DEVICE AND METHOD FOR VERIFYING AN ELECTRICAL OVERVOLTAGE BETWEEN ELECTRICAL CONDUCTORS

CROSS-REFERENCES TO RELATED APPLICATIONS

This application claims the priority of European Patent Application, Serial No. 17211117.1, filed Dec. 29, 2018, pursuant to 35 U.S.C. 119(a)-(d), the disclosure of which is incorporated herein by reference in its entirety as if fully set forth herein.

BACKGROUND OF THE INVENTION

The present invention relates to a verification device and a method for verifying an electrical overvoltage between two electrical conductors.

The following discussion of related art is provided to assist the reader in understanding the advantages of the invention, and is not to be construed as an admission that this related art is prior art to this invention.

Overvoltages between insulated electrical conductors can in particular impair the insulation of the conductors. Insulation typically has production-related defects in the form of pores and gaps with expansions in the micrometer to millimeter range. Overvoltages can cause partial discharges in insulation, which, due to the generally lower dielectric constant, particularly in such defects, ignite according to Paschen's law from a certain field strength of the electrical field due to an avalanche effect of charge carriers. Such partial discharges result in successive degradation of the insulation, particularly in the region of defects, until the insulation fails.

For example, this kind of damage to the insulation of electrical conductors occurs in rotating electrical machines operated with converters or in converter-fed environments. As a rule, a converter generates a square-wave or stepped converter voltage. Due to the steep edges of such a converter voltage, the Fourier spectrum of the converter voltage has spectral components that cause overvoltages on an exciting winding of an electrical machine supplied by the converter, wherein the insulation of the exciting winding is not designed for such overvoltages and they can damage the insulation in the manner described above.

The quality and condition of the insulation of an exciting winding of a rotating electrical machine cannot usually be quantified from the exterior so that it is not possible to predict a total failure of the electrical machine due to an electrical breakdown caused by insulation damage, for example between the exciting windings of two different phases of the machine or between an exciting winding and a grounded conductor.

It would therefore be desirable and advantageous to address these problems and to obviate other prior art shortcomings.

SUMMARY OF THE INVENTION

According to one aspect of the present invention, a verification device for verifying an electrical overvoltage between two electrical conductors includes a conductor-track carrier made of an electrically insulating carrier material, a plurality of conductor tracks applied in spaced-apart relation from one another on the conductor-track carrier, and a measuring device acquiring an electrical resistance of one of the conductor tracks, wherein each of the two electrical conductors is electrically connected to at least one of the conductor tracks with the proviso that none of the conductor tracks is electrically connected to both of the two electrical conductors, the conductor tracks being configured such that a prespecified overvoltage between the two electrical conductors causes a partial discharge that changes the electrical resistance of the one conductor track between the one conductor track and another one of the conductor tracks that is electrically connected to one of the two electrical conductors.

A verification device according to the invention enables the verification of an overvoltage in that the overvoltage changes the electrical resistance of a conductor track so that the overvoltage can be verified by measuring the electrical resistance. Herein, the invention utilizes the fact that the electrical resistance of a suitably embodied conductor track can be changed by a partial discharge. Accordingly, according to the invention, to verify an overvoltage, the overvoltage triggers a partial discharge that changes the electrical resistance of a conductor track in the verification device. In particular, the invention enables the detection of overvoltages at coil windings of an electrical machine without there being any need to switch off or open the machine. As a result, overvoltages which could result in damage to the insulation of the coil windings and ultimately to a total failure of the machine can be detected in good time during the operation of the machine.

According to another advantageous feature of the present invention, the one conductor track can be arranged between two other ones of the conductor tracks that are electrically connected to the two electrical conductors in one-to-one correspondence and is spaced apart from the two other ones of the conductor tracks, the one conductor track being configured in the absence of an electrical connection to the two electrical conductors. In this embodiment of the invention, the conductor track of which the resistance is measured and used to verify the overvoltage is not connected to any one of the electrical conductors between which an overvoltage is to be detected. This is in particular advantageous when a high voltage is applied between the electrical conductors since the measuring device is not electrically connected to any of the electrical conductors and hence does not make contact with the high voltage.

According to another advantageous feature of the present invention, the one conductor track can, as an alternative, be electrically connected to one of the two electrical conductors. Thus, the conductor track of which the electrical resistance is measured and used to verify the overvoltage is connected to one of the electrical conductors between which an overvoltage is to be detected. As a result, the number of conductor tracks of the verification device can be reduced and the verification device can be executed in a more compact and less expensive manner.

According to another advantageous feature of the present invention, the conductor tracks can be made of composite material which includes a non-electrically conductive plastic matrix and a filler which is embedded in the plastic matrix and renders the composite material electrically conductive. Advantageously, the filler can include electrically conductive filler particles arranged to occupy lattice sites of a lattice formed by the plastic matrix with a probability that is greater than a percolation threshold above which the composite material is electrically conductive, the filler particles having an electrical conductivity which is reduced by a partial discharge acting on the filler particles. The filler contains, for example, n-conducting metal oxide, coated or uncoated mica, quartz powder, carbon black, graphite and/or metal. In particular, the filler can contain antinomy-doped tin dioxide and/or fluorine- or indium-doped tin dioxide. Advantageously, the plastic matrix can be made of a chemically crosslinked thermoset or a thermoplastic. Thus, conductor tracks can be realized that have an electrical resistance which is increased by partial discharges as a result of making the conductor tracks of a suitable filled embedded in a plastic matrix. For example, during their production, filler particles made of antimony-doped tin dioxide automatically form oxygen vacancies that act as charge-carrier donors and contribute to the good electrical conductivity of the filler. A partial discharge caused by overvoltage heats the filler locally and causes a local generation of ozone. The temperature rise and the resulting ozone result in the oxidation of surface barrier layers of the filler particles with oxygen vacancies. This reduces the number of oxygen vacancies in the filler and the electrical conductivity of the composite material is reduced or the electrical resistance of the composite material is increased. The same applies to other fillers made of an n-conducting metal oxide that is suitably doped to improve its electrical conductivity, for example with a chemical element with an atomic number in the periodic table of elements that is one higher than the atomic number of the metal of the metal oxide. Filler particles made of carbon black, graphite or metal do not form surface barrier layers of the type described above with partial discharges, but oxidize in the case of partial discharges and thereby lose their electrical conductivity so that the electrical resistance of the composite material also increases in this case.

According to another advantageous feature of the present invention, the conductor tracks can be made of polyaniline or poly(3,4-ethylenedioxythiophene)-polystyrene sulfonate. Such plastics are also suitable as materials for producing the conductor tracks since their electrical conductivity is reduced or destroyed by partial discharges.

According to another advantageous feature of the present invention, each of the conductor tracks can have a thickness of about 100 μm and an electrical sheet resistance of maximum 100 kΩ prior to a partial discharge. This embodiment takes into account the fact that, during the production of the conductor tracks, for example by imprinting the conductor-track carrier, a solvent is required that is evaporated after the application of the conductor track. If the conductor tracks are too thick, evaporation of the solvent leads to cracks or pores in the conductor tracks that impair the quality thereof. A thickness of about 100 μm is a typical value at which the conductor tracks have sufficient electrical conductivity and are not impaired by the evaporation of the solvent. The electrical sheet resistance of an electrically conductive layer, also referred to as sheet resistance, should be understood to mean its specific resistance for a defined layer thickness. An electrical sheet resistance of maximum 100 kΩ is advantageous with a conductor track thickness about 100 μm since otherwise a substantial part of the overvoltage is already dissipated in the conductor tracks.

According to another advantageous feature of the present invention, the conductor-track carrier can be a plate or film. As a result, the verification device can easily and flexibly be used and assembled.

According to another advantageous feature of the present invention, at least one of the two electrical conductors can be electrically connected to several of the plurality of the conductor tracks, the conductor tracks being configured such that different prespecified overvoltages between the electrical conductors cause partial discharges between the one conductor track and different ones of the conductor tracks that are electrically connected to one of the two electrical conductors. In this way, the verification device can be used to verify different overvoltages.

According to another aspect of the present invention, an electrical machine includes two electrical conductors, one of the electrical conductors being one coil winding and the other one of the electrical conductors being another coil winding or a grounded conductor, and a verification device configured to verify an electrical overvoltage between the two electrical conductors, the verification device including a conductor-track carrier made of an electrically insulating carrier material, a plurality of conductor tracks applied in spaced-apart relation from one another on the conductor-track carrier, and a measuring device acquiring an electrical resistance of a first one of the conductor tracks, wherein each of the two electrical conductors is electrically connected to at least one of the conductor tracks with the proviso that none of the conductor tracks is electrically connected to both of the two electrical conductors, the conductor tracks being configured such that a prespecified overvoltage between the two electrical conductors causes a partial discharge that changes the electrical resistance of the one conductor track between the one conductor track and another one of the conductor tracks that is electrically connected to one of the two electrical conductors.

According to another advantageous feature of the present invention, the electrical machine can be constructed in the form of a rotating electrical machine or a transformer. The advantages of such an electrical machine may be derived from the aforementioned advantages of a verification device according to the invention.

According to still another aspect of the present invention, a method for verifying an electrical overvoltage between two electrical conductors with a verification device including plural conductor tracks includes electrically connecting each of the two electrical conductors to at least one of the conductor tracks, measuring an electrical resistance of one of the conductor tracks, and determining the presence of an electrical overvoltage between the electrical conductors when the electrical resistance of the one conductor track assumes a resistance value corresponding to the overvoltage.

A method according to the invention enables a verification of an electrical overvoltage between two electrical conductors by means of a verification device as set forth above by acquiring the electrical resistance of a conductor track of the verification device.

Advantageously, a method according to the invention can find application for verifying an electrical overvoltage at a coil winding of an electrical machine, in particular a rotating electrical machine or a transformer. According to another advantageous feature of the present invention, one of the electrical conductors can be one coil winding of an electrical machine and the other one of the electrical conductors is another coil winding of the electrical machine or a grounded conductor.

BRIEF DESCRIPTION OF THE DRAWING

Other features and advantages of the present invention will be more readily apparent upon reading the following description of currently preferred exemplified embodiments of the invention with reference to the accompanying drawing, in which.

DETAILED DESCRIPTION OF PREFERRED EMBODIMENTS

Figure 1:
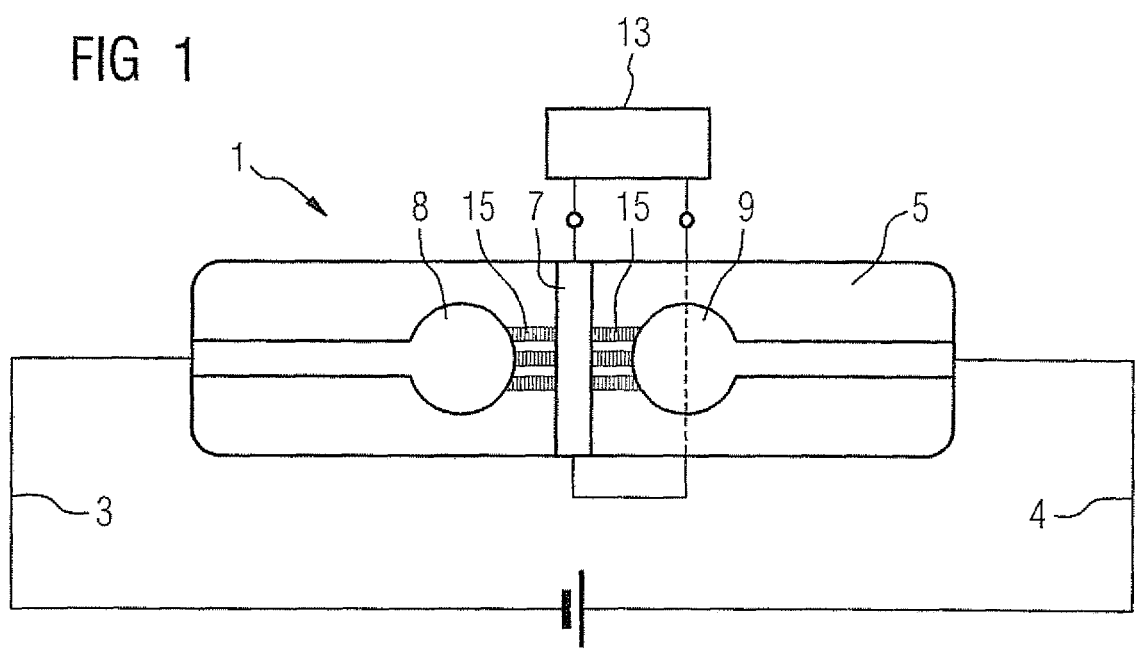
FIG. 1 is a schematic illustration of a first exemplary embodiment of a verification device according to the present invention for verifying an electrical overvoltage.

Throughout all the figures, same or corresponding elements may generally be indicated by same reference numerals. These depicted embodiments are to be understood as illustrative of the invention and not as limiting in any way. It should also be understood that the figures are not necessarily to scale and that the embodiments may be illustrated by graphic symbols, phantom lines, diagrammatic representations and fragmentary views. In certain instances, details which are not necessary for an understanding of the present invention or which render other details difficult to perceive may have been omitted.

Turning now to the drawing, and in particular to FIG. 1, there is shown a schematic illustration of a first exemplary embodiment of a verification device according to the present invention, generally designated by reference numeral 1, for verifying an electrical overvoltage between two electrical conductors 3, 4. The verification device 1 includes a conductor-track carrier 5, three conductor tracks 7, 8, 9 on the conductor-track carrier 5 and a measuring device 13 for acquiring an electrical resistance of a first conductor track 7.

The conductor-track carrier 5 is made of an electrically insulating carrier material that serves as a substrate for the conductor tracks 7, 8, 9 and is embodied as a plate or a film.

The first conductor track 7 is arranged between a second conductor track 8 and the third conductor track 9 and is spaced apart from the second conductor track 8 and the third conductor track 9. The two ends of the first conductor track 7 are connected to the measuring device 13.

The second conductor track 8 and the third conductor track 9 each extend perpendicular to the first conductor track 7. An end of the second conductor track 8 facing the first conductor track 7 and an end of the third conductor track 9 facing the first conductor track 7 are embodied as circular.

The second conductor track 8 is electrically connected to a first electrical conductor 3 and therefore lies on the same electrical potential as the first electrical conductor 3. The third conductor track 9 is electrically connected to the second electrical conductor 4 and therefore lies on the same electrical potential as the second electrical conductor 4.

The conductor tracks 7, 8, 9 are embodied and arranged such that a prespecified overvoltage between the electrical conductors 3, 4 causes a partial discharge 15 between the first conductor track 7 and the second conductor track 8 and/or between the first conductor track 7 and the third conductor track 9 that changes the electrical resistance of the first conductor track 7 to a resistance value corresponding to the overvoltage. To verify the overvoltage, the electrical resistance of the first conductor track 7 is measured and it is concluded that there is an overvoltage when the electrical resistance of the first conductor track 7 assumes the resistance value.

For example, the conductor tracks 7, 8, 9 are made of a composite material 17 which includes a non-electrically conductive plastic matrix 19 and a filler embedded therein 21, thereby rendering the composite material 17 electrically conductive.

Figure 2:
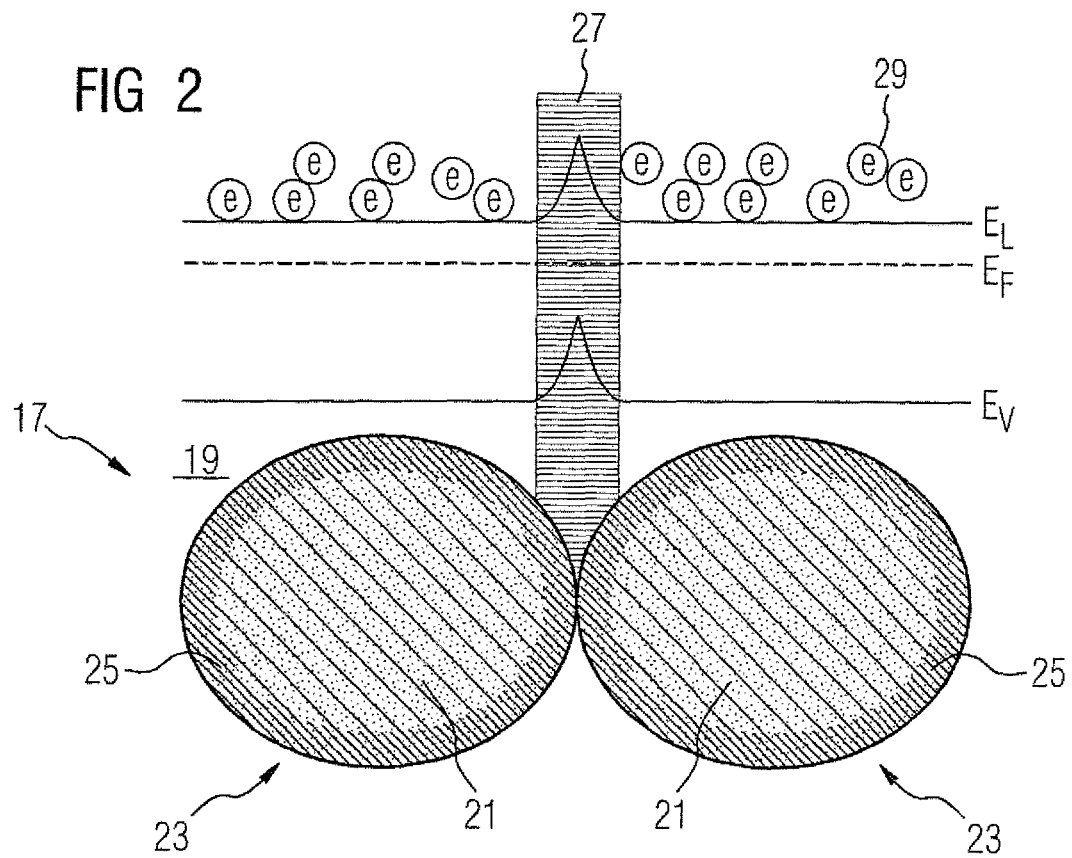
FIG. 2 is a schematic view of two filler particles of a filler embedded in a plastic matrix and energy bands of the filler for use in the verification device of FIG. 1.

FIG. 2 is a schematic view of the structure of an exemplary embodiment of a composite material 17 embodied in this way. The plastic matrix 19 is made of a chemically crosslinked thermoset or a thermoplastic. For example, the plastic matrix 19 is made of an epoxy, silicone, polyurethane or polyetherimide.

The filler 21 includes electrically conductive filler particles 23 that occupy lattice sites of a lattice formed by the plastic matrix 19 with a probability greater than a percolation threshold above which the composite material 17 is electrically conductive. Therefore, the filler particles 23 form a coherent particle network in the plastic matrix 19, that renders the composite material 17 electrically conductive.

The filler 21 is for example a n-conducting metal oxide doped with a chemical element with an atomic number in the periodic table of elements that is one higher than the atomic number of the metal of the metal oxide. For example, the filler 21 is antinomy-doped tin dioxide, a manganese-doped chromium oxide, a cobalt-doped iron oxide or a nickel-doped cobalt oxide. During their production, such fillers 21 form oxygen vacancies that act as charge-carrier donors and contribute to the good electrical conductivity of the filler 21. A partial discharge caused by an overvoltage heats up the filler 21 locally and causes a local generation of ozone. The temperature rise and the resultant ozone result in the oxidation of surface barrier layers 25 of filler particles 23 with oxygen vacancies. This reduces the number of oxygen vacancies in the filler 21 and the electrical conductivity of the composite material 17 is reduced or the electrical resistance of the composite material 17 is increased.

FIG. 2 is an exemplary and schematic sectional view of two contiguous filler particles 23 which include antimony-doped tin dioxide as a filler 21 and surface barrier layers 25 that have been oxidized by a partial discharge. FIG. 2 further shows the courses of an upper valence band limit $E_V$ of a valence band, a lower conduction band limit $E_L$ of a conduction band and the Fermi energy $E_F$ of the filler 21 along the filler particles 23. The oxidation of the filler particles 23 causes the upper valence band limit $E_V$ and the lower conduction band limit $E_L$ to rise in a contact zone 27 in which the surface barrier layers 25 of the filler particles 23 abut one another. Hence, a potential barrier for electrons 29 in the conduction band forms in the contact zone 27 and this increases the electrical resistance of the composite material 17.

Instead of one of the aforementioned materials, however, the filler 21 can also be another material, for example an undoped n-conducting metal oxide, a fluorine- or indium-doped n-conducting metal oxide, coated or uncoated mica, quartz powder, carbon black, graphite and/or metal, for example copper. If the filler 21 is copper, the filler particles 23 are, for example, copper flakes. Filler particles 23 made of carbon black, graphite or metal do not form any surface barrier layers 25 of the above-described kind in the case of partial discharges, but oxidize in the case of partial discharges and thereby lose their electrical conductivity so that the electrical resistance of the composite material 17 increases.

Alternatively, instead of being made from one the aforementioned composite materials 17, the conductor tracks 7, 8, 9 can be made of an electrically conductive plastic, for example polyaniline (PANI) or poly(3,4-ethylenedioxythiophene)-polystyrene sulfonate (PEDOT:PSS), the electrical conductivity of which is reduced or destroyed by partial discharges.

Figure 3:
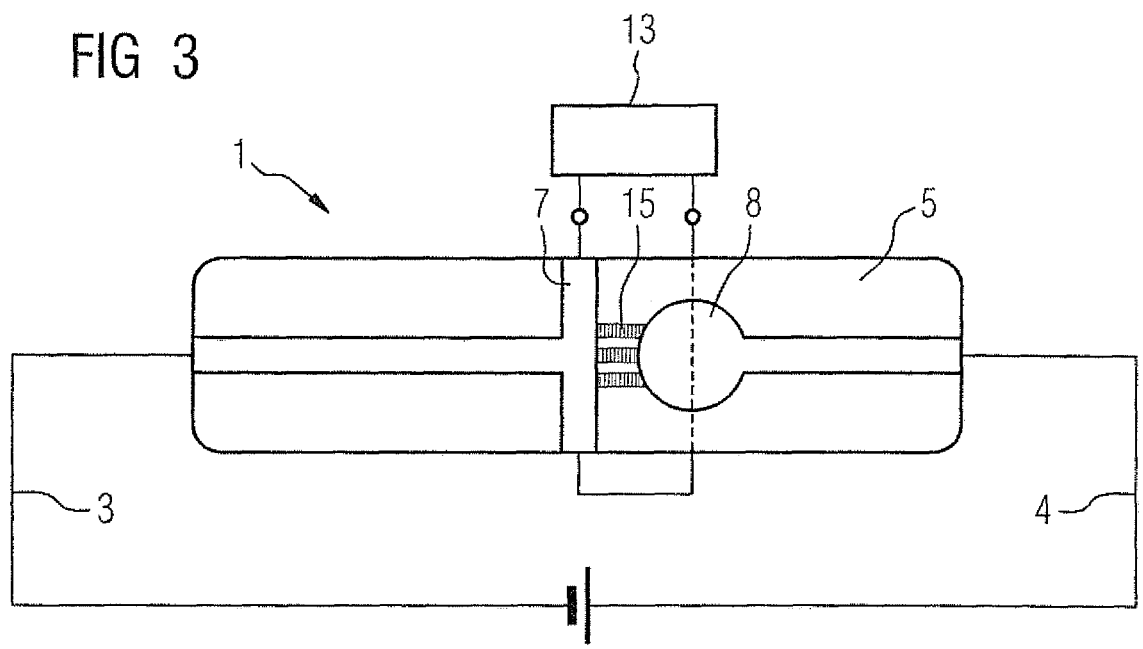
FIG. 3 is a schematic illustration of a second exemplary embodiment of a verification device according to the present invention for verifying an electrical overvoltage.

FIG. 3 shows a second exemplary embodiment of a verification device 1 for verifying an electrical overvoltage between two electrical conductors 3, 4. This exemplary embodiment differs from the exemplary embodiment shown in FIG. 1 in that only two conductor tracks 7, 8 are applied to the conductor-track carrier 5. Herein, a first conductor track 7 is electrically connected to a first electrical conductor 3 and the second conductor track 8 is electrically connected to the second electrical conductor 4. The first conductor track 7 is also electrically connected to the measuring device 13 for acquiring an electrical resistance of the first conductor track 7.

The conductor tracks 7, 8 are embodied and arranged such that a prespecified overvoltage between the electrical conductors 3, 4 causes a partial discharge 15 between the first conductor track 7 and the second conductor track 8 that changes the electrical resistance of the first conductor track 7 to a resistance value corresponding to the overvoltage. To verify the overvoltage, the electrical resistance of the first conductor track 7 is measured and it is concluded that there is an overvoltage if the electrical resistance of the first conductor track 7 assumes the resistance value.

Figure 4:
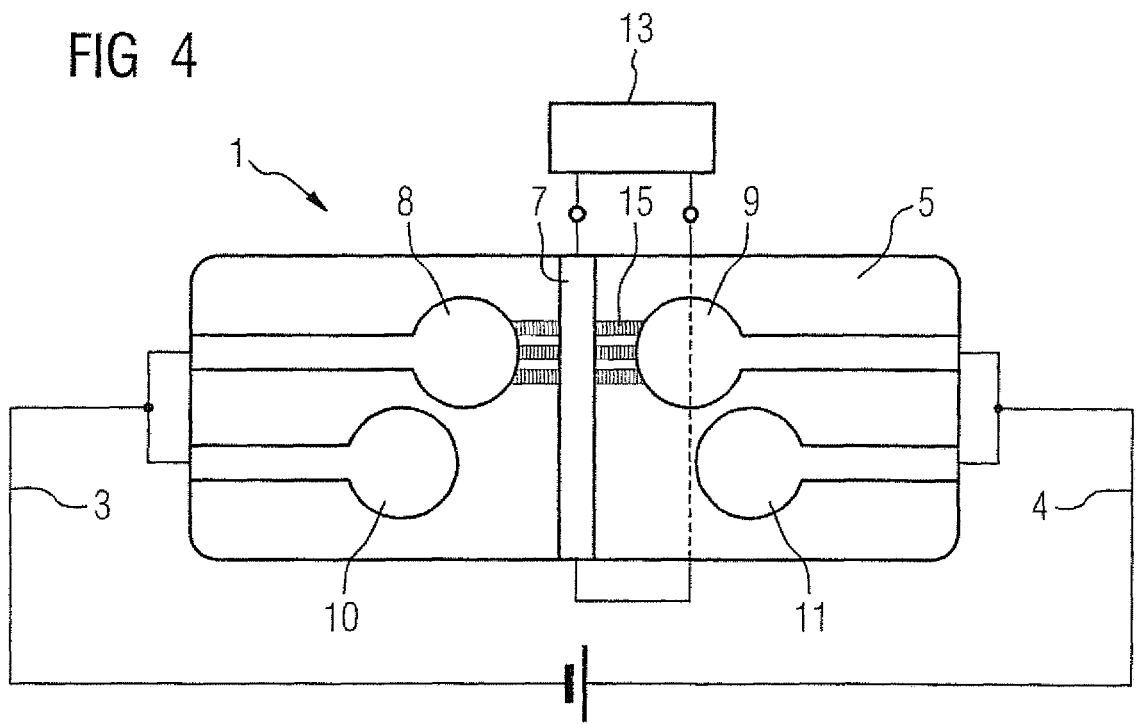
FIG. 4 is a schematic illustration of a third exemplary embodiment of a verification device according to the present invention for verifying an electrical overvoltage.

FIG. 4 shows a third exemplary embodiment of a verification device 1 for verifying an electrical overvoltage between two electrical conductors 3, 4. This exemplary embodiment differs from the exemplary embodiment shown in FIG. 1 in that five conductor tracks 7 to 11 are applied to the conductor-track carrier 5 spaced apart from one another.

A first conductor track 7 extends approximately in the middle of the conductor-track carrier 5 between two opposite edges of the conductor-track carrier 5. The two ends of the first conductor track 7 are connected to a measuring device 13 for acquiring an electrical resistance of a first conductor track 7.

A second conductor track 8 and a fourth conductor track 10 are electrically connected to a first electrical conductor 3 and extend perpendicular to the first conductor track 7 on a first side of the first conductor track 7. The ends of the second conductor track 8 and the fourth conductor track 10 facing the first conductor track 7 are each embodied as circular and have different distances from the first conductor track 7.

A third conductor track 9 and the fifth conductor track 11 are electrically connected to the second electrical conductor 4 and extend perpendicular to the first conductor track 7 on a second side of the first conductor track 7 opposite to the first side. The ends of the third conductor track 9 facing the first conductor track 7 and the fifth conductor track 11 each embodied as circular and have different distances from the first conductor track 7.

In the exemplary embodiment shown in FIG. 4, the distances of the ends of the second conductor track 8 and the third conductor track 9 facing the first conductor track 7 are the same and the distances of the ends of the fourth conductor track 10 and the fifth conductor track 11 facing the first conductor track 7 are also the same.

The conductor tracks 7 to 11 are embodied and arranged such that, as shown in FIG. 4, a prespecified first overvoltage between the electrical conductors 3, 4 causes partial discharges 15 between the first conductor track 7 and the second conductor track 8 and/or between the first conductor track 7 and the third conductor track 9 and that a prespecified second overvoltage between the electrical conductors 3, 4, which is greater than the first overvoltage, additionally partial discharges 15 between the first conductor track 7 and the fourth conductor track 10 and/or between the first conductor track 7 and the fifth conductor track 11, wherein the partial discharges caused by the first overvoltage change the electrical resistance of the first conductor track 7 to a first resistance value corresponding to the first overvoltage and the partial discharges caused by the second overvoltage change the electrical resistance of the first conductor track 7 to a second resistance value corresponding to the second overvoltage, which is greater than the first resistance value. To verify the overvoltages, the electrical resistance of the first conductor track 7 is measured. It concluded that there is a first overvoltage if the electrical resistance of the first conductor track 7 assumes the first resistance value. It is concluded that there is a second overvoltage if the electrical resistance of the first conductor track 7 assumes the second resistance value.

Therefore, the verification device 1 shown in FIG. 4 is able to verify two different overvoltages. Increasing the number of conductor tracks 8 to 11 with different distances from the first conductor track 7 enables the exemplary embodiment shown in FIG. 4 to be modified such that a still greater number of different overvoltages can be verified.

The conductor tracks 7 to 11 of the exemplary embodiments shown in FIGS. 3 and 4 are in each case made of one of the materials cited in the above description of the exemplary embodiment shown in FIG. 1. The conductor tracks 7 to 11 of the exemplary embodiments shown in FIGS. 1, 3 and 4 each have, for example, a thickness of about 100 μm and an electrical sheet resistance of maximum 100 kΩ prior to a partial discharge. The conductor tracks 7 to 11 are, for example, applied to the conductor-track carrier 5 by a screen printing or dispenser printing method.

The verification devices 1 described with reference to the figures are in particular suitable for verifying overvoltages in an electrical machine, in particular a rotating electrical machine or a transformer. Herein, at least one of the electrical conductors 3, 4 is a coil winding of the electrical machine. For example, the two electrical conductors 3, 4 are exciting windings of two different phases of a multi-phase rotating electrical machine or one of the two electrical conductors 3, 4 is an exciting winding of a rotating electrical machine and the other electrical conductor 3, 4 is a grounded conductor, or one of the two electrical conductors 3, 4 is a primary winding or secondary winding of a transformer and the other electrical conductor 3, 4 is a grounded conductor. Herein, a coil winding of the electrical machine at a winding end or in the interior of the coil winding can be electrically connected to at least one conductor track 7 to 11. For example, a conductor track 7 to 11 is electrically connected to an electrical conductor 3, 4 via a terminal of a terminal box or switchgear cabinet. A verification device 1 of the type shown in FIG. 4 can be used for electrical machines of different performance classes in order to verify overvoltages each corresponding to one performance class.

While the invention has been illustrated and described in connection with currently preferred embodiments shown and described in detail, it is not intended to be limited to the details shown since various modifications and structural changes may be made without departing in any way from the spirit and scope of the present invention. The embodiments were chosen and described in order to explain the principles of the invention and practical application to thereby enable a person skilled in the art to best utilize the invention and various embodiments with various modifications as are suited to the particular use contemplated.

What is claimed as new and desired to be protected by Letters Patent is set forth in the appended claims and includes equivalents of the elements recited therein:

What is claimed is:

1. A verification device for verifying an electrical overvoltage between two electrical conductors, said verification device comprising:
   a conductor-track carrier made of an electrically insulating carrier material;
   a plurality of mutual spaced-apart conductor tracks disposed on the conductor-track carrier, wherein one of the conductor tracks extends perpendicularly to others of the plurality of conductor tracks; and
   a measuring device measuring an electrical resistance between two ends of the one of the conductor tracks, wherein each of the two electrical conductors is electrically connected to at least one of the conductor tracks and none of the conductor tracks is electrically connected to both of the two electrical conductors, said conductor tracks being configured such that a prespecified overvoltage between the two electrical conductors causes a partial discharge between the one conductor track and another one of the plurality of the conductor, which changes the electrical resistance between the two ends of the one of the conductor tracks.

2. The verification device of claim 1, wherein the one conductor track is arranged between two other ones of the conductor tracks that are electrically connected to the two electrical conductors in one-to-one correspondence and is spaced apart from said two other ones of the conductor tracks, said one conductor track being electrically isolated from the two electrical conductors.

3. The verification device of claim 1, wherein the one conductor track is electrically connected to one of the two electrical conductors.

4. The verification device of claim 1, wherein the conductor tracks are made of composite material comprising a non-electrically conductive plastic matrix and a filler which is embedded in the plastic matrix and renders the composite material electrically conductive.

5. The verification device of claim 4, wherein the filler comprises electrically conductive filler particles arranged to occupy lattice sites of a lattice formed by the plastic matrix with a probability that is greater than a percolation threshold above which the composite material is electrically conductive, said filler particles having an electrical conductivity which is reduced by a partial discharge acting on the filler particles.

6. The verification device of claim 4, wherein the filler contains at least one member selected from the group consisting of n-conducting metal oxide, coated or uncoated mica, quartz powder, carbon black, graphite, and metal.

7. The verification device of claim 4, wherein the filler contains at least one member selected from the group consisting of antinomy-doped tin dioxide and fin dioxide doped with fluorine or indium.

8. The verification device of claim 4, wherein the plastic matrix is made of chemically crosslinked thermoset or thermoplastic.

9. The verification device of claim 1, wherein the conductor tracks are made of electrically conductive plastic.

10. The verification device of claim 9, wherein the conductor tracks are made of polyaniline or poly(3,4-ethylenedioxythiophene)-polystyrene sulfonate.

11. The verification device of claim 1, wherein each of the conductor tracks has a thickness of about 100 μm and an electrical sheet resistance of maximum 100 kΩ prior to a partial discharge.

12. The verification device of claim 1, wherein the conductor-track carrier is a plate or film.

13. The verification device of claim 1, wherein at least one of the two electrical conductors is electrically connected to several of the plurality of the conductor tracks, said conductor tracks being configured such that different prespecified overvoltages between the electrical conductors cause partial discharges between the one conductor track and different ones of the several conductor tracks that are electrically connected to the at least one of the two electrical conductors.

14. An electrical machine, comprising:
   two electrical conductors, one of the electrical conductors being one coil winding and the other one of the electrical conductors being another coil winding or a grounded conductor; and
   a verification device configured to verify an electrical overvoltage between the two electrical conductors, said verification device comprising a conductor-track carrier made of an electrically insulating carrier material; a plurality of mutually spaced-apart conductor tracks disposed on the conductor-track carrier, wherein one of the conductor tracks extends perpendicularly to others of the plurality of conductor tracks; and a measuring device measuring an electrical resistance between two ends of the one of the conductor tracks, wherein each of the two electrical conductors is electrically connected to at least one of the conductor tracks and none of the conductor tracks is electrically connected to both of the two electrical conductors, said conductor tracks being configured such that a prespecified overvoltage between the two electrical conductors causes a partial discharge between the one conductor track and another one of the plurality of the conductor, which changes the electrical resistance between the two ends of the one of the conductor tracks.

15. The electrical machine of claim 14, constructed in the form of a rotating electrical machine or a transformer.

16. A method for verifying an electrical overvoltage between two electrical conductors with a verification device including mutually spaced-apart plural conductor tracks disposed on an electrically insulating conductor-track carrier, wherein one of, the conductor tracks extends perpendicularly to others of the plurality of conductor tracks, said method comprising:
   electrically connecting each of the two electrical conductors to at least one of the conductor tracks;
   measuring an electrical resistance between two ends of the at least one of the conductor tracks; and
   determining the presence of an electrical overvoltage between the electrical conductors when the electrical resistance between the two ends of the at least one of the conductor tracks changes.

17. The method of claim 16, wherein one of the electrical conductors is one coil winding of an electrical machine and another one of the electrical conductors is another coil winding of the electrical machine or a grounded conductor.

18. The method of claim 17, wherein the electrical machine is a rotating electrical machine or a transformer.

* * * * *